United States Patent
Schmidt et al.

(10) Patent No.: US 11,302,378 B2
(45) Date of Patent: Apr. 12, 2022

(54) SEMICONDUCTOR CIRCUIT INCLUDING AN INITIALIZATION CIRCUIT FOR INITIALIZING MEMORY CELLS AND CLEARING OF RELATIVELY LARGE BLOCKS OF MEMORY

(71) Applicant: INTERNATIONAL BUSINESS MACHINES CORPORATION, Armonk, NY (US)

(72) Inventors: Martin Bernhard Schmidt, Stuttgart (DE); Peter Altevogt, Ettlingen (DE); Wolfgang Gellerich, Boeblingen (DE); Juergen Pille, Stuttgart (DE); Christoph Raisch, Gerlingen (DE)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/922,428

(22) Filed: Jul. 7, 2020

(65) Prior Publication Data
US 2022/0013159 A1    Jan. 13, 2022

(51) Int. Cl.
*G11C 7/20* (2006.01)
*G11C 11/4072* (2006.01)
(Continued)

(52) U.S. Cl.
CPC ...... *G11C 11/4072* (2013.01); *G11C 11/4074* (2013.01); *G11C 11/4085* (2013.01); *G11C 11/4094* (2013.01); *G11C 11/4097* (2013.01)

(58) Field of Classification Search
CPC ............ G11C 11/4072; G11C 11/4085; G11C 11/4097; G11C 11/4094; G11C 11/4074
See application file for complete search history.

(56) References Cited

U.S. PATENT DOCUMENTS

| 5,297,104 A * | 3/1994 | Nakashima | ......... G11C 11/4085 |
|---|---|---|---|
| | | | 365/230.06 |
| 5,517,451 A * | 5/1996 | Okuzawa | ................. G11C 7/12 |
| | | | 365/189.16 |

(Continued)

FOREIGN PATENT DOCUMENTS

| CN | 204045210 U | 12/2014 |
| CN | 106844045 A | 6/2017 |
| CN | 109992530 A | 7/2019 |

OTHER PUBLICATIONS

IBM: List of IBM Patents or Patent Applications Treated as Related (Appendix P), Jul. 7, 2020, pp. 1-2.

(Continued)

*Primary Examiner* — Mushfique Siddique
(74) *Attorney, Agent, or Firm* — Steven M. Bouknight

(57) ABSTRACT

The disclosure relates to an initialization circuit for initializing memory cells of a memory array. The individual memory cells are coupled to a common bit line of the memory array via at least one pass element of the individual memory cells. Each individual memory cell comprises a charge-based storage element including a capacitance. The initialization circuit activates the pass elements of a plurality of the memory cells to be initialized such that the capacitances of the plurality of memory cells are connected simultaneously to the common bit line. Further, aspects of the disclosure relate to a method for initializing memory cells and a semiconductor circuit.

11 Claims, 5 Drawing Sheets

(51) Int. Cl.
    *G11C 11/4074*     (2006.01)
    *G11C 11/4097*     (2006.01)
    *G11C 11/4094*     (2006.01)
    *G11C 11/408*     (2006.01)

(56) References Cited

U.S. PATENT DOCUMENTS

| | | | |
|---|---|---|---|
| 5,652,730 A * | 7/1997 | Kono | G11C 8/12 |
| | | | 365/226 |
| 5,909,390 A | 6/1999 | Harari | |
| 6,519,177 B1 * | 2/2003 | Brown | G11C 7/20 |
| | | | 365/154 |
| 7,161,842 B2 | 1/2007 | Park | |
| 7,804,718 B2 | 9/2010 | Kim | |
| 7,821,831 B2 | 10/2010 | Lovett | |
| 8,320,190 B2 * | 11/2012 | Lueng | G11C 11/4076 |
| | | | 365/185.25 |
| 8,588,024 B2 | 11/2013 | Patel et al. | |
| 9,263,111 B2 | 2/2016 | Ha | |
| 9,558,808 B2 | 1/2017 | Parris | |
| 9,679,632 B2 | 6/2017 | Mohammad et al. | |
| 9,864,544 B2 | 1/2018 | Oh et al. | |
| 9,952,802 B2 | 4/2018 | Salah et al. | |
| 10,585,619 B1 | 3/2020 | Schmidt et al. | |
| 10,748,590 B2 * | 8/2020 | Koo | G11C 29/10 |
| 10,901,651 B2 | 1/2021 | Schmidt | |
| 2011/0032775 A1 | 2/2011 | Lovett | |
| 2012/0230143 A1 * | 9/2012 | Patel | G11C 11/418 |
| | | | 365/230.06 |
| 2013/0148442 A1 | 6/2013 | Ijitsu | |
| 2015/0170748 A1 | 6/2015 | Costa et al. | |
| 2016/0293244 A1 | 10/2016 | Mohammad et al. | |
| 2019/0392179 A1 * | 12/2019 | Lu | G11C 7/20 |
| 2020/0159440 A1 | 5/2020 | Schmidt et al. | |

OTHER PUBLICATIONS

Pending U.S. Appl. No. 16/922,370, filed Jul. 7, 2020, entitled: "Erasing a Partition of an SRAM Array With Hardware Support", pp. 1-26.
Disclosed Anonymously, "How to clear RAM", liutilities.com, Free Resource Libraries, URL: http://www.liutilities.com/how-to/clear-ram/, printed May 28, 2020, 3 pages.

* cited by examiner

SEMICONDUCTOR CIRCUIT INCLUDING AN INITIALIZATION CIRCUIT FOR INITIALIZING MEMORY CELLS AND CLEARING OF RELATIVELY LARGE BLOCKS OF MEMORY

BACKGROUND

The disclosure relates to computer memory. More specifically, the disclosure relates to the initialization of memory blocks in computer memory.

Computer memory may be organized in a hierarchy, from processor registers, over multiple cache levels, to external main memory. The highest or uppermost cache level is the one closest to the processor, and the lowest cache level is the one closest to the main memory. Access latency is lowest, and bandwidth is highest, for registers and upper cache levels.

Memory block initialization, e.g., clearing of relatively large blocks of memory so that each cell in the block of memory holds the same value (e.g., all cells hold '0', or all cells hold '1') after the initialization is completed, may be performed relatively frequently in a computer system, and may affect overall system performance.

SUMMARY

Aspects of the disclosure relate to an initialization circuit for initializing memory cells of a memory array. The individual memory cells are coupled to a common bit line of the memory array via at least one pass element of the individual memory cells. Each individual memory cell comprises a charge-based storage element including a capacitance. The initialization circuit activates the pass elements of a plurality of the memory cells to be initialized such that the capacitances of the plurality of memory cells are connected simultaneously to the common bit line.

Further, aspects of the disclosure relate to a method for initializing memory cells of a memory array, wherein the individual memory cells are coupled to a common bit line of the memory array via at least one pass element of the individual memory cells, wherein each individual memory cell comprises a charge-based storage element including a capacitance. The method comprises activating the pass elements of a plurality of the memory cells to be initialized such that the capacitances of the plurality of memory cells are connected simultaneously to the common bit line.

Other aspects of the disclosure relate to a semiconductor circuit comprising a memory array and an initializing circuit.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

DETAILED DESCRIPTION

Figure 1:
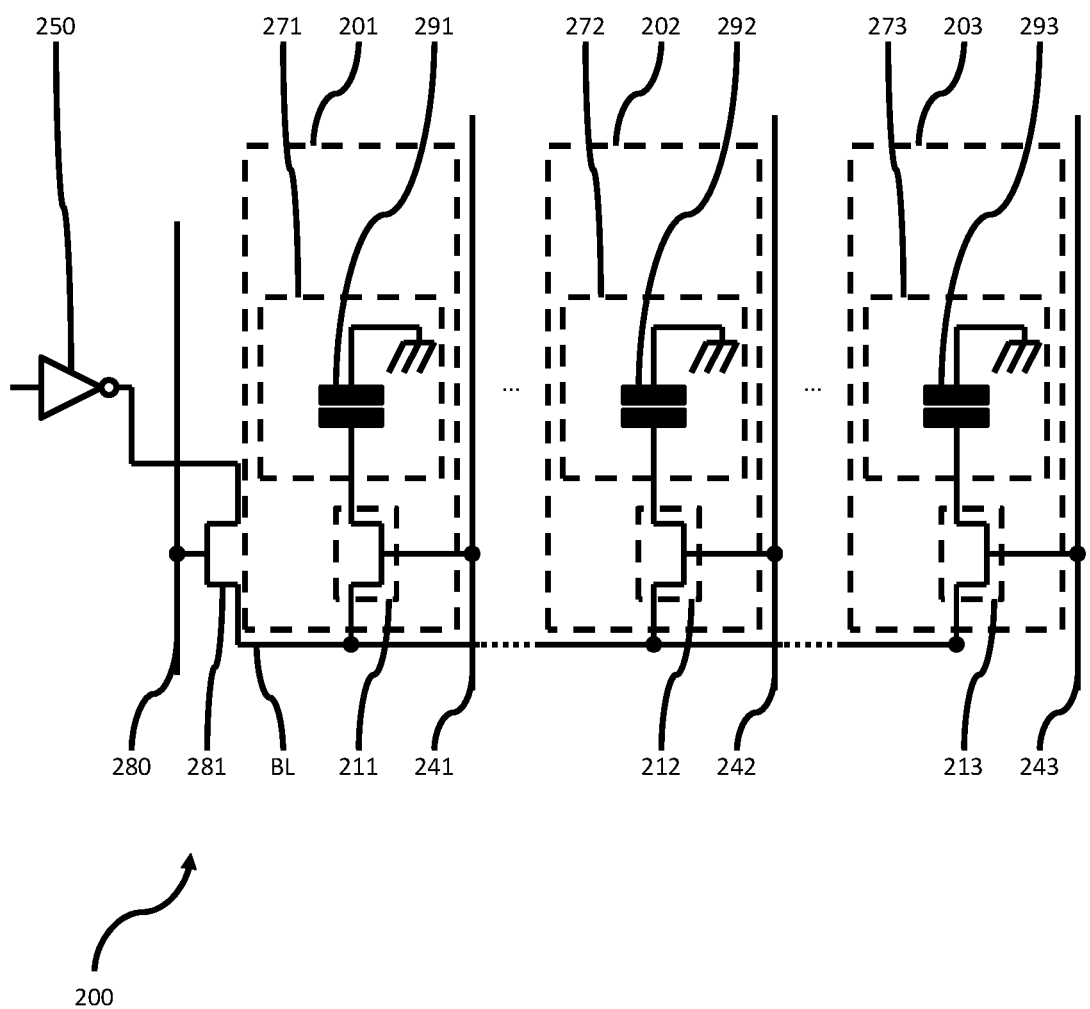
FIG. 1 shows a memory array.

FIG. 1 shows memory cells 201, 202, 203 of an exemplary memory array 200. The memory array 200 includes a common bit line BL. The individual memory cells 201, 202, 203 are coupled to the common bit line BL of the memory array 200 via respective pass elements 211, 212, 213. In particular, each individual memory cell includes a pass element for connecting the memory cell to the common bit line BL. For example, the memory cell 201 includes the pass element 211, the memory cell 202 includes the pass element 212 and the memory cell 203 includes the pass element 213.

Word lines 241, 242, 243 may be used to activate the pass elements 211, 212, 213 in order connect the respective memory cells 201, 202, 203 to the common bit line BL.

A data driver 250 provides the voltage and current required to write data into storage elements 271, 272, 273 of the individual memory cells 201, 202, 203. A write signal line 280 and a write transistor 281 may be used to connect the data driver 250 to the bit line BL. The storage element 271, 272, 273 of the memory cells 201, 202, 203 are charge-based storage element 271, 272, 273 including a capacitance 291, 292, 293. In particular, the memory array 200 may correspond to a dynamic random access memory (DRAM) array and the memory cells 201, 202, 203 may correspond to DRAM cells.

During a read operation, the pass element of the memory cell to be read is activated to connect the memory cell to the bit line. If the memory cell stores a '1' the charge on the capacitor of the memory cell will be distributed on the bit line. The larger bit line voltage may be detected by a read sense amplifier (not shown). If the cell stores a '0', the charge on the bit line will be partially put onto the connected capacitor. Again, the reduced bit line voltage may be detected by the read sense amplifier.

During write operation, the pass element of the memory cell to be written is activated. The data driver will charge or discharge the cell capacitor. Discharging the capacitor may decrease the VSS potential near the cell below the typical VSS potential. A large voltage drop may lead to overvoltage at a transistor and reduce lifetime and performance Charging the capacitor may increase the VSS potential near the memory cell above the typical VSS potential. This may translate into increased power noise. The increased power noise may have to be covered by the voltage margin for the whole chip.

Only three memory cells 201, 202, 203 are shown for simplification purposes. Typically, the number of memory cells connected to a common bit line corresponds to a power of two. For example, the number of memory cells connected to a common bit line may amount to up to or more than 1024 memory cells for area optimized memory arrays.

Usually, a memory array comprises not only one but several bit lines with respective memory cells and the word lines 241, 242, 243, respectively, may be used to connect the respective memory cells to the respective bit lines.

As explained above, the pass elements of the individual memory cells of the memory array may be activated by respective word lines. The memory array may comprise 2 power N ($2^N$) word lines, wherein each word line may be addressed with an address word with N bits. For example, the memory array may comprise $2^4$ word lines which may be addressed with address words 0000 to 1111, respectively.

Figure 2:
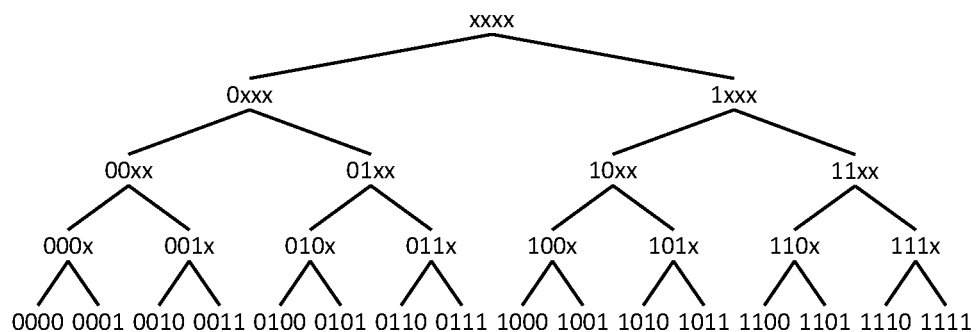
FIG. 2 shows a binary tree.

The address words may be visualized in a binary tree as shown in FIG. 2, wherein the lowest row shows the actual address words of the individual word lines.

As explained above, initializing a memory block in a memory array may be performed relatively frequently in a computer system and may affect overall system performance A memory block may refer to a large number of sub-sequent memory cells along parallel bit lines. Initializing may be understood as writing the same content in the respective memory cells. For example, after initialization, all initialized memory cells hold '0' or all initialized memory cells hold '1'. Typically, initializing a large number of sub-sequent entries in a memory array may be performed on a word line by word line basis. Hence, the number of processor cycles to perform the initialization increases linearly with the number of the to be initialized entries.

Activating all word lines of a memory array may lead to excessive current draw, which may lead to substantial power noise in the whole semiconductor circuit comprising the memory array. Hence, a higher voltage margin may have to be provided to ensure proper operation of the semiconductor circuit. This may require reducing the maximum clock frequency of the semiconductor circuit. Moreover, it may increase the power consumption of the whole circuit.

It has been found that it may be advantageous to increase the number of memory cells connected to the bit line step after step. In a first step, one or only a few memory cells are initialized. These initialized memory cells may help in the next step to initialize further memory cells. After each step, more memory cells have been initialized and can help in the subsequent step to initialize others.

For charge-based memory cells, the maximum charge that must be provided by the data driver and the VSS supply may be given by the on-voltage of a memory cell $U_{ON}$ and the capacity $Cc_{ell}$ of the capacity of the memory cell. For exemplary purposes, it may be assumed that initialization requires that the content of all memory cells has to be inverted, i.e., that all capacitors of all memory cells have to be charged, and that the memory cells are initialized starting with a single memory cell and connecting in each subsequent step a number of memory cells to the bit line corresponding to the number of memory cells already connected to the bit line.

For initializing a single memory cell in a first step i=1 a charge $$Q_1 = U_{ON} * C_{Cell}$$

may have to be provided. In a second step i=2, the initialized memory cell will help to initialize a single second memory cell. To initialize the single second memory cell, a charge $$Q_2 = 2^0 * U_{ON} * C_{Cell}$$

may have to be provided. In the next step i, the already initialized memory cells may be used to help initializing a number of memory cells corresponding to the number of already initialized memory cells. Heretofore, a charge $$Q_i = 2^{i-2} * U_{ON} * C_{Cell}$$

may have to be provided.

In the first step i=1 (one memory cell connected to the bit line), the available low resistance capacity for the charge Q_1 is given by the capacity $C_{bitline}$ of the bit line and the capacity of the single memory cell:

$$C_1 = 2^0 * C_{Cell} + C_{bitline}$$

In the second step i=2, the available low resistance capacity for the charge $Q_2$ is given by the capacity of the bit line $C_{bitline}$ and the capacities of the two memory cells connected to the bit line:

$$C_2 = 2^1 * C_{Cell} C_{bitline}$$

In step i the available low resistance capacity for the charge $Q_i$ is given by:

$$C_i = 2^{i-1} * C_{Cell} + C_{bitline}$$

Due to the low resistance the charge in each step may be quickly distributed on the bit line and the capacitors of the memory cells connected to the bit line. Accordingly, the voltage across the capacitors of the memory cells connected to the bit line may be given in the first step i=1 by $$U_1 = \frac{Q_1}{C_1} = U_{ON} * \frac{C_{Cell}}{C_{Cell} + C_{bitline}} \approx 0$$

because $C_{bitline} \gg C_{Cell}$

In the second step i=2 the voltage across the capacitors of the memory cells connected to the bit line may be given by $$U_2 = \frac{Q_2}{C_2} = U_{ON} * \frac{C_{Cell}}{2 * C_{Cell} + C_{bitline}} \approx 0$$

because $C_{bitline} \gg C_{Cell}$

In step i the voltage across the capacitors of the memory cells connected to the bit line may then be given by $$U_i = \frac{Q_i}{C_i} = 2^{i-2} * U_{ON} * C_{Cell} / (2^{i-1} * C_{Cell} + C_{bitline})$$

For large i, the term $2^{i-1} * C_{Cell}$ becomes considerably greater than $C_{bitline}$ resulting in $$\lim_{i \to \infty} U_i = 2^{-1} * U_{ON}$$

The immediate reduction of the voltage to the half of the voltage of the nominal capacitor voltage due to the other capacitors already connected to the bit line may reduce the local current draw dramatically, and local current hot spots may be avoided. This may reduce power noise and voltage margins of the semiconductor circuit may be decreased.

The new memory cells to be initialized in each iteration step may be more or less evenly distributed along the bit line. Moreover, only a part of the memory cells to be initialized will have to be inverted typically. However, in the last iteration steps several memory cells having to be inverted may be close to each other. This may result in higher local current upon initialization. Hence, the number of memory cells to be initialized in may increase less in the last iterations. For example, the number of activated word lines could follow a binary power series in the first iterations and increase linearly in the last iterations.

Figure 3:
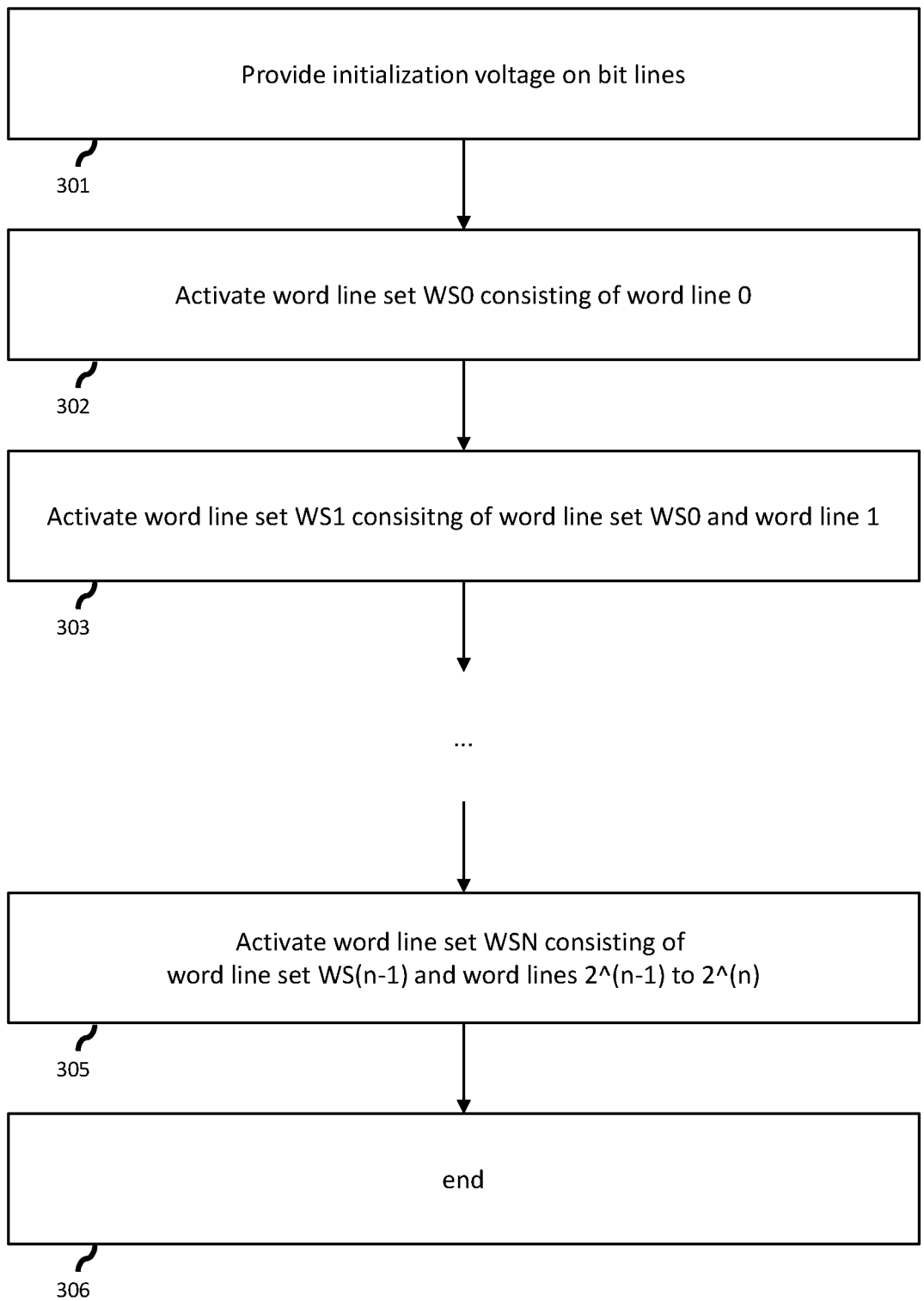
FIG. 3 illustrates a method for initializing a memory array.

FIG. 3 illustrates a method for initializing memory cells of a memory array.

In step 301, the data drivers are set to provide the initialization voltage for the bit lines of the memory array. Then, in step 302, a first word line set WL0 is activated, wherein the word line set WL0 consists of the word line 0

(e.g., the word line 0000 of FIG. 2). In the next step 303, a word line set WL1 may be activated consisting of the word line set WL0 and the word line 1 (e.g., the word line set WL1 may consists of the word lines 0000 and 0001 of FIG. 3). Further word lines may be activated until in step 305, word line set WL(n) consisting of word line set WL(n−1) and word lines $2^{(n-1)}$ to $2^{(n)}$ is activated. As all word lines are now activated, the methods ends (step 306).

Figure 4:
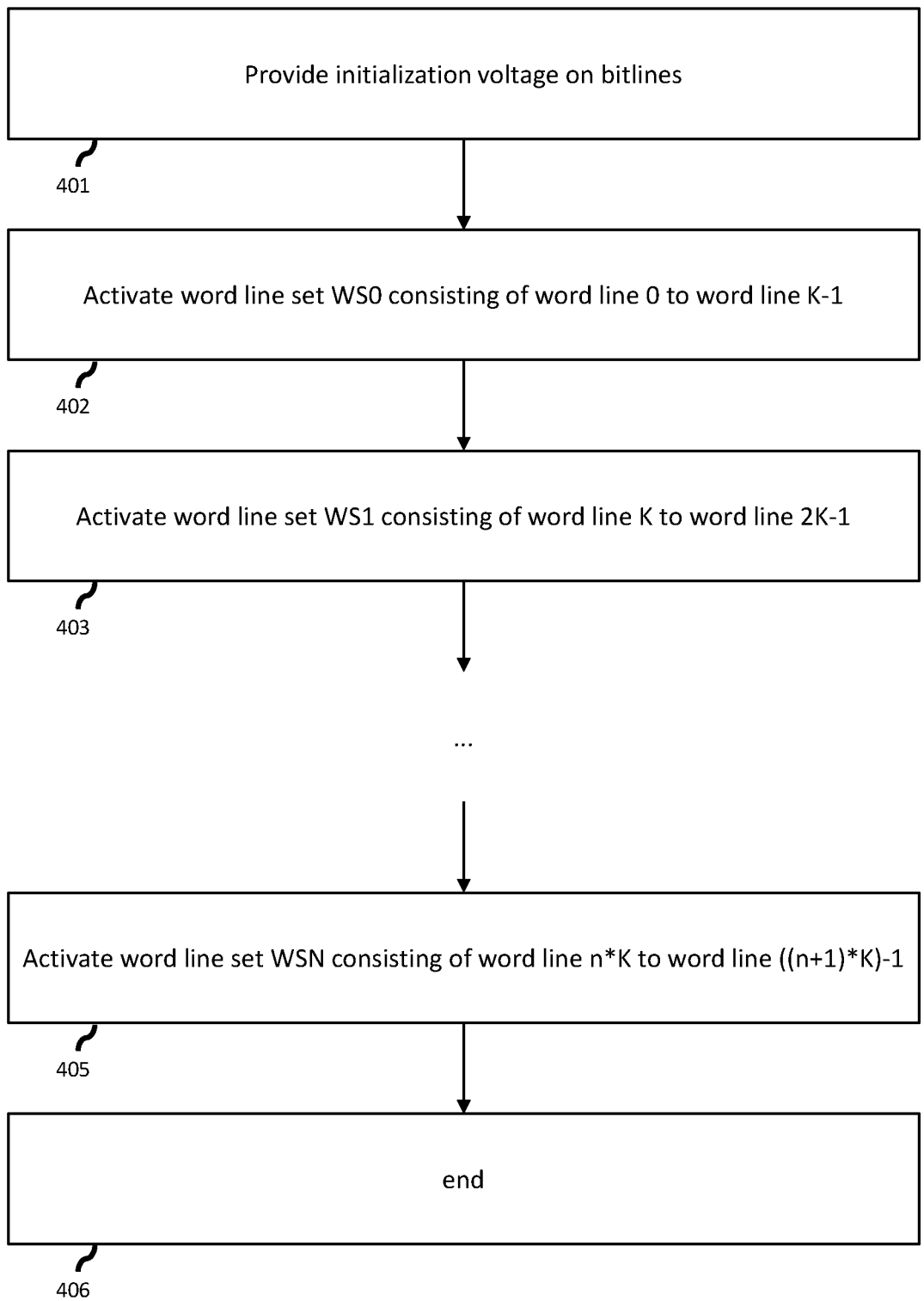
FIG. 4 illustrates a method for initializing a memory array.

FIG. 4 illustrates a further method for initializing memory cells of a memory array.

In step 401, the data drivers are set to provide the initialization voltage for the bit lines of the memory array. Then, in step 402, a first word line set WL0 is activated, wherein the word line set WL0 consists of word line 0 to word line k−1. In the next step 403, a second word line set WL1 is activated, wherein the word line set WL1 consists of word line k to word line 2k−1. This is repeated until in step 405 the word line set WL(n) consisting of word line n*K to word line ((n+1)*K)−1) is activated, i.e. until all word lines are activated. Then, the method ends (step 406).

Figure 5:
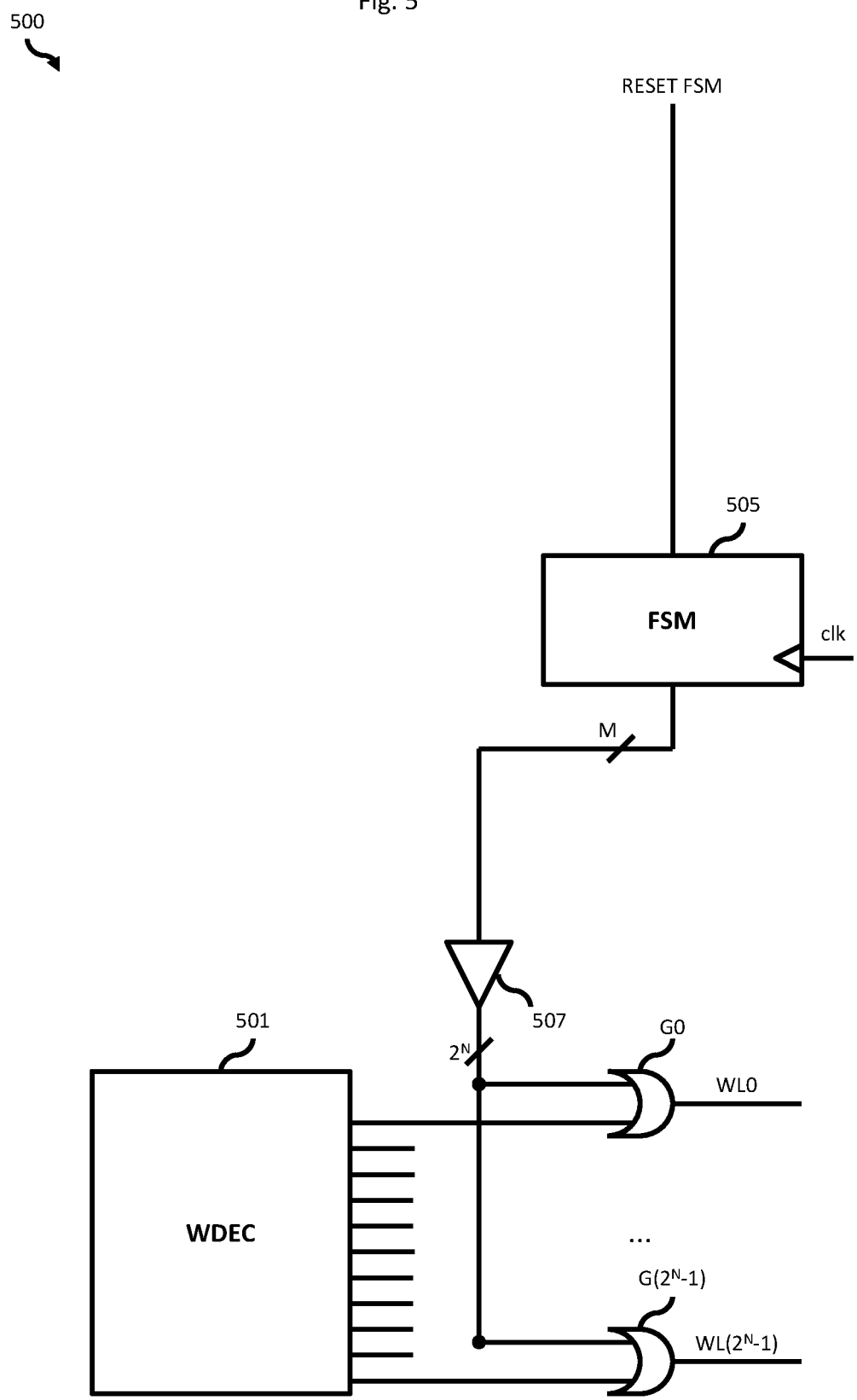
FIG. 5 shows an initialization circuit.

FIG. 5 shows an exemplary initialization circuit 500 for initializing memory cells of a memory array. The initialization circuit 500 may be used for initializing memory cells of the memory array 200 shown in FIG. 1.

The initialization circuit 500 may be used for initializing memory cells of a memory array comprising $2^N$ word lines WL0 to WL($2^N$−1). The second inputs of the OR-gates G0 to G($2^N$−1) may be used for initializing memory cells of the memory array. Each word line may be addressed with an address word with N bits, wherein each address word may be separated into a partition word with P bits and a remainder word with K bits. The initialization circuit 500 comprises a word decoder (WDEC) 501 which addresses the word lines WL0 to WL($2^N$−1) during normal reading and writing operations. Heretofore, the outputs of the word decoder (WDEC) 501 are connected to respective first inputs of OR-gates G0 to G($2^N$−1). The outputs of the OR-gates G0 to G($2^N$−1) are connected to the word lines WL0 to WL($2^N$−1).

The second inputs of the OR-gates G0 to G($2^N$−1) may be used for initializing memory cells of the memory array. In particular, the second inputs of the OR-gates G0 to G($2^N$−1) may be used to activate the pass elements of the memory cells connected to the word lines WL0 to WL($2^N$−1) so that the memory cells are connected to the respective bit lines. The data value to be written into the memory cells to be initialized may be provided by a data driver which is not shown in FIG. 5. The data value may be selected such that all initialized cells hold '0' or all initialized cells hold '1' after initialization.

Before starting initializing, an input RESET FSM of a counter 505 may receive a signal reset fsm='1' and transmit a signal comprising K zeros. Accordingly, the counter 505 will not transmit any activation signal to the OR-gates G0 to G($2^N$−1). Accordingly, the word lines WL0 to WL($2^N$−1) will only be activated depending on the signal(s) transmitted by the word decoder 501.

Word line sets WLS0 to WLS(M−1) may be specified, wherein each word line set WLS0 to WLS(M−1) may define a number of word lines which are (additionally) to be activated in a (first) next iteration of the initialization of the partition to be initialized.

The counter 505 may be used for sequentially activating the word line sets WLS0 to WLS(M−1). In particular, the counter 505 may transmit a signal indicating the word line sets which are to be activated. The last digit of the signal may indicate whether the word line set WLS0 is to be activated, the penultimate digit of the signal may indicate whether the word line set WLS1 is to be activated, etc. Finally, the first digit of the signal may indicate whether the word line set WLS(M−1) is to be activated.

The counter 505 may be a finite state machine (FSM) comprising a thermometer counter. In a first clock cycle after resetting the counter 505, the counter may transmit a signal 00 . . . 001 indicating that the first word line set WLS0 is to be activated, in the next clock cycle the counter 505 may transmit a signal 00 . . . 011 indicating that the first and the second word line sets WLS0 and WLS1 are to be activated. Each time the counter 505 is incremented an additional digit is given the value of 1 until the counter 505 finally transmits a signal 11 . . . 111 indicating that all word line sets WLS0 to WLS(M−1) are to be activated.

The counter 505 transmits a signal to the word line set decoder 507 indicating which word line sets are to be activated for initializing. The word line set decoder 507 may receive the signal from the counter 505 and activate the word lines of the activated word line sets of the partitions to be initialized. The number of activated word lines increases with activated word line sets. The total number of activated word lines may double with each additionally activated word line set. For example, activating a first word line set WLS0 may activate one ($2^0$) single word line, additionally activating a second word line set WLS1 may activate an additional word line resulting in two ($2^1$) activated word lines, additionally activating a third word line set WLS2 may activate additional two word lines resulting in four ($2^2$) activated word lines, etc. Thus, the total number of activated word lines may follow a binary power series. Using a binary power series for activating the word lines may reduce in a low total latency for the initialization procedure.

In the example of FIG. 2, a first word line set WLS0 may consist of the single word line 0000, a second word line set WLS1 may consist of the word lines 000x, i.e. of the word lines 0000 and 0001, a third word line set WLS2 may consist of the word lines 00xx, i.e. of the word lines 0000, 0001, 0010 and 0011.

The initialization circuit 500 of FIG. 5 may be used to initialize a large memory block in a memory array in a short amount of time.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for initializing memory cells of a memory array,
    wherein the individual memory cells are coupled to a common bit line of the memory array via at least one pass element of the individual memory cells,
    wherein each individual memory cell comprises a charge-based storage element including a capacitance,
    wherein the memory cells are initiated by successively increasing a number of capacitances connected to the common bit line and activating pass elements of the memory cells,
    wherein successively increasing the number of capacitances comprises using already initialized memory cells to initialize a number of the memory cells corresponding to a number of the already initialized memory cells, and wherein during a read operation, the at least one pass element of a memory cell to be read is activated to connect the memory cell to the common bit line, and in response to detecting that the memory cell stores a one, distributing on the common bit line a charge from the charge-based storage element of the memory cell, and in response to detecting that the memory cell stores a zero, partially putting the charge from the common bit line onto the charge-based storage element.

2. The method of claim 1,
wherein the memory array is a DRAM array, and
wherein the individual memory cells are DRAM cells.

3. The method of claim 1,
wherein the memory array comprises a data driver,
wherein an output of the data driver is connected to the common bit line,
wherein an initialization circuit controls the data driver so that a voltage level of the bit line is forced to a value corresponding to a logical level.

4. The method of claim 1,
wherein the number of memory cells with activated pass elements is successively doubled.

5. The method of claim 1,
wherein successively increasing the number of memory cells with activated pass elements starts with activating the at least one pass element of a single memory cell.

6. The method of claim 1, further comprising:
activating the pass elements of the memory cells to be initialized such that the capacitances of the memory cells are connected simultaneously to the common bit line.

7. Method for initializing memory cells of a memory array,
wherein the individual memory cells are coupled to a common bit line of the memory array via at least one pass element of the individual memory cells,
wherein each individual memory cell comprises a charge-based storage element including a capacitance,
wherein the method comprises
activating pass elements of a plurality of the memory cells to be initialized such that capacitances of the plurality of memory cells are connected simultaneously to the common bit line, and
initializing the plurality of memory cells by successively increasing a number of the capacitances connected to the common bit line, wherein successively increasing the number of capacitances comprises using already initialized memory cells associated with the plurality of memory cells to initialize a number of the plurality of memory cells corresponding to a number of the already initialized memory cells, and
wherein during a read operation, the at least one pass element of a memory cell to be read is activated to connect the memory cell to the common bit line, and in response to detecting that the memory cell stores a one, distributing on the common bit line a charge from the charge-based storage element of the memory cell, and in response to detecting that the memory cell stores a zero, partially putting the charge from the common bit line onto the charge-based storage element.

8. Method of claim 7,
wherein the memory array is a DRAM array, and
wherein the individual memory cells are DRAM cells.

9. Method of claim 7, further comprising
forcing a voltage level of the bit line to a value corresponding to a logical level.

10. Method of claim 7,
wherein the number of the plurality of memory cells with activated pass elements is successively doubled.

11. Method of claim 7,
wherein successively increasing the number of the plurality of memory cells with activated pass elements starts with activating the pass element of a single memory cell.

* * * * *